United States Patent
Kopp et al.

(10) Patent No.: US 7,723,854 B2
(45) Date of Patent: May 25, 2010

(54) ASSEMBLY AND METHOD OF ASSEMBLING BY SOLDERING AN OBJECT AND A SUPPORT

(75) Inventors: Christophe Kopp, Fontanil-Cornillon (FR); Francois Baleras, Seyssinet (FR); Christophe Martinez, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 53 days.

(21) Appl. No.: 11/748,109

(22) Filed: May 14, 2007

(65) Prior Publication Data
US 2007/0284414 A1   Dec. 13, 2007

(30) Foreign Application Priority Data
Jun. 6, 2006   (FR) .................................. 06 04984

(51) Int. Cl.
*H01L 23/48* (2006.01)
(52) U.S. Cl. ................. 257/779; 257/E23.069
(58) Field of Classification Search ......... 257/779, 257/E23.069
See application file for complete search history.

(56) References Cited

U.S. PATENT DOCUMENTS

| | | | |
|---|---|---|---|
| 5,897,335 A | 4/1999 | Wyland et al. | |
| 6,130,476 A * | 10/2000 | LaFontaine et al. | 257/678 |
| 6,647,036 B1 * | 11/2003 | Sun et al. | 372/36 |
| 2002/0153092 A1 | 10/2002 | Rinne | |
| 2003/0098511 A1 | 5/2003 | Moon et al. | |
| 2003/0111727 A1 | 6/2003 | Kurusu | |

* cited by examiner

*Primary Examiner*—Brook Kebede
(74) *Attorney, Agent, or Firm*—Burr & Brown

(57) ABSTRACT

This assembly of an object and a support is achieved by using solder bumps. At least two wettability areas are made respectively on an object and on a support. Each solder bump ensures electrical contact and mechanical fixing firstly to one of the wettability areas of object and secondly to one of the wettability areas of support. The melting temperature of solder bumps is lower than the melting temperature of each of the wettability areas. Each wettability area of the object forms an angle of 70° to 110° with respect to each wettability area of the support and the object and the support are mutually distant from one another.

8 Claims, 5 Drawing Sheets

ASSEMBLY AND METHOD OF ASSEMBLING BY SOLDERING AN OBJECT AND A SUPPORT

FIELD OF THE INVENTION

The present invention relates to assembling an object such as a miniaturized optoelectronic component on a support such as a platform by using solder bumps. During the assembly which is the subject of this invention, the object is positioned extremely accurately relative to the support.

This invention also relates to a method for assembling an object and a support by using a solder material.

DESCRIPTION OF THE PRIOR ART

In the field of miniaturized devices, accurate positioning of miniaturized components becomes more and more indispensable as the degree of miniaturization increases. Thus, great accuracy may be required in order to position a component relative to another component but also to position a component relative to its support. In fact, if the dimensions of the support have slight geometric defects, the support may be used as a reference in order to ensure accurate positioning of components relative to each other.

This applies in particular to components that must fulfil an optical or a mechanical function. In fact, in both these cases, the alignment of the components that transmit and receive a light beam or the alignment of a mechanical microactuator and its sensor are absolutely crucial to the operation of the entire device.

The current trend towards increasing miniaturization of such circuits and such components makes it increasingly difficult to achieve assembly of such objects on their support, firstly because of the reduced dimensions of the assembly surfaces and secondly because of the need for increased accuracy.

Miniaturized components which require accurate positioning include optical components, optoelectronic components and mechanical, magnetic and electromechanical components such as Micro-Electro-Mechanical System (MEMS) chips. Components in these various categories can fulfil a wide variety of functions.

Optical components are generally "passive", i.e. they require no electrical power supply in order to process the light that they receive. Examples of optical components include components that perform a light-guiding function such as a mirror, an optical fiber or a lens or even components that perform a spectral filtering (optical cavity) or spatial filtering (isolator, filter in the Fourier plane). Also, some optical components can be "active", for example in order to fulfil an optical amplification function, as in the case of a diode-pumped solid-state microlaser.

Optoelectronic components are generally active, i.e. they have an electronic interface and require a power supply in order to process the received and/or emitted light. Optoelectronic components which require accurate positioning include light emitters such as diode-pumped solid-state microlaser emitters, Vertical Cavity Surface Emitting Lasers (VCSEL) or polarizers, the function of which is, by definition, to modify the polarization of the light that passes through them.

Miniaturized components having a mechanical function include actuators and sensors that have a moving part, the function of which is to transmit or detect stresses or movements. This is the case with inertial sensor units such as accelerometers, gyroscopes and other magnetometers. This is also the case with a device that makes a uniaxial measurement and can be assembled so as to form a triaxial measuring system.

It is readily apparent that most miniature components with an optical, optoelectronic and/or mechanical function require accurate positioning relative to their support or relative to other components with which they interact and form a coherent assembly. In particular, in the case of laser beams, it is very often necessary to accurately align emitters, receivers and intermediate components relative to each other in order to transmit as much information and/or power as possible.

The first prior-art solution is to assemble an object, usually a miniaturized component and a support, which is generally flat, by using a well-known technique referred to as "flip chip". This widely adopted technique is used to make electrical connections for miniaturized electronic components, especially microelectronic components.

This technology may use soldering by means of solder bumps positioned between the "chip" and its support. During the assembly process, the melted solder material assumes a globule shape because it is in contact with wettability areas produced on the chip and the support respectively. These wettability areas are actually defined so as to favor the formation of solder bumps through the well-known phenomenon of surface tension.

As wettability areas are produced on the active face of the chip during its fabrication, this active face faces the platform that acts as a support. Conversely, if the electrical connections of the component are made by means of wire bonding, the active face of the chip generally faces outwards, i.e. in the opposite direction to the support.

The assembly shown in FIG. 1 has a Vertical Cavity Surface Emitting Laser (VCSEL) 101 with a platform 102 drilled to accommodate an optical fiber 105, as in the case of Document US-A-2003/0 098 511. Optical fiber 105 is intended to guide, in a known manner, a laser beam 104 emitted by emitter 101. Emitter 101 is assembled with platform 102 by means of solder bumps 103 using a "flip chip" technique. Using this technique, each of the bumps 103 is formed by reflowing the solder material between laser emitter 101 and platform 102.

More precisely, each of the bumps 103 is formed in contact with two wettability areas (not shown), generally speaking of a metallic nature, arranged respectively on object 101 and on support 102. These wettability areas are dimensioned and positioned so as to allow alignment of object 101 with support 102 thanks to the phenomenon of surface tension. This alignment (parallelism in the example in FIG. 1) is made possible by the fact that bumps 103 consist of an identical quantity of solder material.

When an assembly process using a "flip chip" technique is used, solder bumps 103 allow a kind of "self-alignment" of emitter 101 relative to platform 102. In fact, this alignment is obtained due to the effect of surface tension forces which exert themselves so as to produce an equilibrium whereby the surface energy at the interface between the solder bump and its wettability area is minimal. In a known manner, with such equilibrium, the position and shape of solder bump 103 are symmetrical relative to its wettability area. When laser emitter 101 is thus aligned on the support, the entire laser beam 104 which it emits is transmitted to optical fiber 105, provided that the latter is also correctly positioned on the support.

Nevertheless, such a method of assembling has drawbacks. It is necessary to drill platform 102 and insert optical fiber 105 in the drilled hole. These operations become increasingly tricky as the size of the components to be manipulated decreases. In the case of miniaturized components, having micrometric dimensions for instance, these operations are particularly difficult to perform and the resulting accuracy may be mediocre.

Alternatively, in order to avoid drilling the platform, it is possible to place the laser emitter in another direction so that the beam is emitted outwardly, i.e. in a direction opposite to the platform.

Nevertheless, it is then necessary to fit a 90° deflection mirror in order to direct the laser beam towards the other components located on the surface of the platform, such as an optical fiber. Such a layout is difficult and expensive to achieve. It also poses the problem of alignment of the components, involves additional hardware cost (cost of mirror), and may degrade the performance of the laser beam.

In order to overcome these problems, a prior-art solution shown in FIG. 2 involves assembling Vertical Cavity Surface Emitting Laser (VCSEL) 201 perpendicular to platform 202. Laser emitter 201 emits laser beam 204 in a direction that is parallel to the surface of platform 202. Laser beam 204 can then be transmitted to optical fiber 205 by lens 206.

Document U.S. Pat. No. 6,647,036 describes a VCSEL laser emitter positioned on a microelectronic platform at a predetermined angle, particularly at 90°. According to this method, the object is initially secured by means of a vacuum pump which is firmly in contact with the support before being attached to the support by means of remelted solder bumps.

Nevertheless, the method described in this document has several disadvantages. Firstly, with such a method, it is also necessary to drill the platform in order to be able to secure the object by suction and keep it in contact with the platform and this involves additional fabrication costs.

What is more, the accuracy obtained by such assembly is relatively precarious and inadequate in applications where the miniaturization of components exceeds a certain threshold. According to this document, the accuracy with which the laser beam is aligned on the platform is apparently only roughly 2 to 3 micrometers for components having dimensions of the order of several hundred micrometers (U.S. Pat. No. 6,647,036: col. 3, l. 55-60).

The required contact between the object and the support is one of the factors that limits the accuracy of the alignment operation performed using this method. The surface of the object intended to come into contact with the support is usually obtained by being cut out and therefore has an irregular geometry which is likely to adversely affect alignment of the laser beam.

Also, the wettability areas or "pads" on the platform are too far or not far enough apart relative to the thickness of the object, i.e. the laser emitter, there is a risk of relative misalignment. Similarly, if these "pads" are not appropriately arranged on the object, there is a risk of the object being incorrectly aligned relative to the support.

Such positional defects are shown in FIGS. 3a to 3c. In the assembly in FIG. 3a, wettability areas 311 of object 301 are too "high" and this makes it awkward to bring object 301 and support 302 into contact and for the surface tension forces to establish equilibrium. In the assemblies in FIGS. 3b and 3c, wettability areas 312 of support 302 are not far enough apart and there is also a risk, when positioning object 301, of preventing the surface tension forces establishing equilibrium.

Consequently, the assembly and method of assembling described in Document U.S. Pat. No. 6,647,036 does not make it possible to achieve a satisfactory accuracy when positioning the object relative to the support and also poses numerous risks of failure, i.e. imperfect alignment or even non-alignment.

The object of the present invention is therefore an assembly and a method of assembling by soldering an object and a support that do not have the disadvantages of the prior art, i.e. an assembly and a method of assembling that are not excessively awkward to implement and offer positional accuracy that does not depend on factors that are too numerous or difficult to master.

SUMMARY OF THE INVENTION

The present invention therefore relates to assembly of an object and a support by soldering involving a simple structure that offers high positional accuracy and relatively little expense given the high accuracy achieved.

The object of the invention is therefore an assembly and a method of assembling an object and a support by using solder bumps. At least two wettability areas are made on the object and the support respectively and each of the solder bumps ensures electrical contact with and mechanical fixing to one of the wettability areas of the object on the one hand and one of the wettability areas of the support on the other hand. Moreover, the melting temperature of the solder bumps is lower than the melting temperature of each of the wettability areas. According to the invention, each wettability area of the object forms an angle of 70° to 110° with respect to each wettability area of the support. Also, the object and the support are mutually distant.

In other words, there is a substantial angle between the object and the support and no contact between the object and the support, assembly of the one with the other being obtained exclusively by means of solder bumps.

In one practical embodiment of the invention, this angle may be substantially equal to 90°.

Such an angle between the wettability areas of the object and those of the support makes it possible to present the object substantially at right angles relative to the support and, as a result, limit the mechanical stresses that it exerts on the solder bumps. In addition, it makes it possible to position certain components such as a Vertical Cavity Surface Emitting Laser (VCSEL) advantageously.

In a second embodiment of the invention, the lower part of the object may be accommodated in a cavity made in the support, with the lower edge of the object not touching the bottom of the cavity.

In other words, the lower part of the object may be accommodated in a cavity made in the support without coming into contact with the cavity. This makes it possible to limit the extent to which the object protrudes beyond the surface of the support in particular as well as ensuring relative positional accuracy.

In one embodiment of the invention, the solder bumps may have different dimensions.

Such a feature makes it possible to produce solder bumps that fulfil various functions: small bumps in order to optimize the positional accuracy of the object relative to the support and large bumps in order to support the object appropriately without it coming into contact with the support. This also makes it possible to form a specific angle between every wettability area of the object and every wettability area of the support.

In practice, the solder bumps may be made of a material consisting of a pure element or an alloy of elements selected from the group comprising tin (Sn), lead (Pb), gold (Au) and indium (In).

Such a material has a relatively low melting temperature which can therefore be reached easily and quickly and, indirectly, this affords a wide choice of materials from which other accompanying components can be made.

In one practical embodiment of the invention, every wettability area may comprise a stack of several layers of materials consisting of elements selected from the group comprising titanium (Ti), nickel (Ni) and gold (Au).

Such materials may provide sufficient wetting for the solder bumps.

In practice, the support may be a microelectronic platform and the object may be an optical or optoelectronic component such as a Vertical Cavity Surface Emitting Laser (VCSEL).

Such an assembly makes it possible to emit a laser beam accurately in a plane which is parallel to the plane formed by the microelectronic platform.

Also, the present invention pertains to a method of assembling by soldering an object and a support which is relatively simple to implement, affordable and results in highly accurate relative positioning of the object and the support.

The method of assembling an object and a support uses a solder material, at least two wettability areas being produced on the object and support respectively.

Moreover, the melting temperature of the solder material is lower than the melting temperature of each of the wettability areas. According to the invention, the method of assembling involves:

forming solder bumps on the support or on the object by means of a succession of steps involving:
producing, on every wettability area of the object or on every wettability area of the support, underbump metallization consisting of the solder material;
heating the underbump metallizations to above the melting temperature of the solder material but below the melting temperature of each of wettability area so as to turn each of the underbump metallizations into a solder bump due to surface tension;
cooling down the assembly obtained to a temperature below the melting temperature of the solder material so as to solidify the solder bumps thus formed;
positioning the object relative to the support so as to place each of the solder bumps substantially and partially opposite the surface of each wettability area of the object on the one hand and a corresponding surface of each wettability area of the support on the other hand, with each wettability area of the object forming an angle of 70° to 110° with respect to each wettability area of the support;
heating the underbump metallizations to above the melting temperature of the solder material so as to form and move the solder bumps by surface tension so as to ensure cooperation between each solder bump and one of the wettability areas of the object on the one hand and one of the wettability areas of the support on the other hand;
cooling down the assembly obtained to a temperature below the melting temperature of the solder material so as to solidify the assembly thus formed.

In other words, there is only mechanical and electrical contact between the solder bumps and the wettability areas of the object on the one hand and between the solder bumps and the wettability areas of the support on the other hand. Thus, there is no contact between the object and the support. Consequently, assembly of the former relative to the latter obtained by using such a method is likely to offer high positional accuracy.

In a first embodiment of the method which is the subject of the invention, the step to form the solder bumps may comprise a succession of steps involving:

depositing on the wettability areas of the object a sacrificial coating that is relatively non-wetting in relation to the solder material and having a melting temperature higher than that of the solder material, the sacrificial coating extending asymmetrically over the main surface of each wettability area of the object:
drilling, in said sacrificial coating, holes each emerging on main surface of a wettability area of the object and towards that part of the wettability area of the object which is opposite the closest edge of the object;
producing underbump metallizations by depositing solder material on the sacrificial coating, as well as in the hole;
heating the underbump metallizations to above the melting temperature of the solder material so as to turn them, due to surface tension, into solder bumps that wholly or partly cover the sacrificial coating;
removing the sacrificial coating, each bump then being connected to a wettability area by a stalk originating from the solder material deposited in said hole, the stalk being positioned on that part of the wettability area opposite the closest edge of the object;
cutting the edge of the object closest to the wettability area so as to reduce one of the dimensions of the object;
heating the solder bumps to above their melting temperature so as to completely cover each of the wettability areas, the periphery of the solder bumps extending beyond the edge of the object obtained by said cutting, the bumps covering the wettability areas of the support due to the effect of surface tension.

This method therefore makes it possible to form solder bumps on the wettability areas of the object and then attach them to the wettability areas of the support. This method which uses a sacrificial coating in order to position each solder bump prior to attaching it to the wettability areas of the object and the support makes it possible to avoid insufficient or excessive spacing of the solder bumps during the final step of assembling the object and the support.

In a second embodiment of the method that is the subject of the invention, the step to form the solder bumps may comprise a succession of steps involving:

depositing on the wettability areas of the support a sacrificial coating that is relatively non-wetting in relation to the solder material and having a melting temperature higher than that of the solder material, the sacrificial coating extending asymmetrically over the main surface of each wettability area of the object:
drilling, in the sacrificial coating, holes which each emerge on the main surface of a wettability area of the support and are offset towards the end opposite the other wettability area of the support;
producing underbump metallizations by depositing solder material on the sacrificial coating, as well as in the holes;
heating the underbump metallizations to above the melting temperature of the solder material so as to turn them, due to surface tension, into solder bumps that wholly or partly cover the sacrificial coating;
removing the sacrificial coating, each bump then being connected to a wettability area by a stalk originating from the solder material deposited in said hole, the stalk being positioned on the wettability area at the end opposite the other wettability area of the support;

This method therefore makes it possible to form solder bumps on the wettability areas of the support and then attach them to the wettability areas of the object. This method which uses a sacrificial coating in order to position each solder bump prior to attaching it to the wettability areas of the object and the support makes it possible to avoid insufficient or excessive spacing of the solder bumps during the final step of assembling the object and the support.

In one practical embodiment of the invention, the support may have, between its two wettability areas, at least one additional wettability area having dimensions smaller than those of each of the two wettability areas, the additional wettability area being subjected to a step to form solder bumps identical to that described above, with or without offsetting of the associated hole. Moreover, the step to position the object may comprise a succession of steps involving:

positioning the object between the two large bumps in contact with the small bump;

heating the solder bumps to above the melting temperature of the solder material so as to substantially cover each wettability area of the object and the support due to the effect of surface tension.

In another embodiment of the invention, the method also comprises a step consisting of making, in the support, a cavity intended to accommodate the lower part of the object and the step to position the object may comprise a succession of steps involving:

positioning the lower part of the object in the cavity so that the wettability areas of the object are at a height above that of the center of gravity of the object and above the height of the upper surface of the support;

heating the solder bumps to above the melting temperature of the solder material so as to substantially cover, due to the effect of surface tension, each wettability area of the support and the object which is capable of aligning itself vertically due to, firstly, the effect of gravity and, secondly, the surface tension forces produced by the melting solder bumps on the wettability areas of the object.

In other words, this method involves using the weight of the object in order to align it vertically, like a plumb line, with the surface tension forces exerted by the solder bumps on the wettability areas of the object acting as restoring forces that keep the object in a stable position.

BRIEF DESCRIPTION OF THE DRAWINGS

The way in which the invention can be implemented and its resulting advantages will be made more readily understandable by the descriptions of the following embodiments, given merely by way of example, reference being made to the accompanying drawings.

FIG. 1 has already been described in reference to the prior state of the art.

FIG. 2 has already been described in reference to the prior state of the art.

FIGS. 3a to 3c have already been described in reference to the prior state of the art.

FIG. 4d shows the final step using this method and is therefore also a schematic view of a first embodiment of the assembly which is the subject of the invention.

FIG. 5d shows the final step using this method and is therefore also a schematic view of a second embodiment of the assembly which is the subject of the invention.

FIG. 10b shows the final step using this method and is therefore a schematic view of a sixth embodiment of the assembly which is the subject of the invention.

DETAILED DESCRIPTION OF THE INVENTION

Figure 4A:
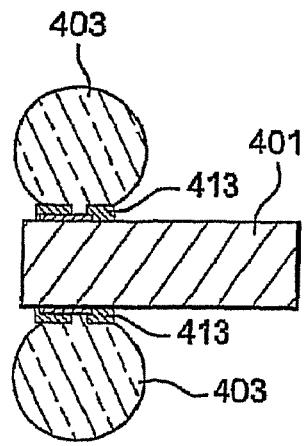
FIGS. 4a to 4d are schematic side views showing certain steps in a first embodiment of the method of assembling which is the subject of this invention.
Figure 4B:
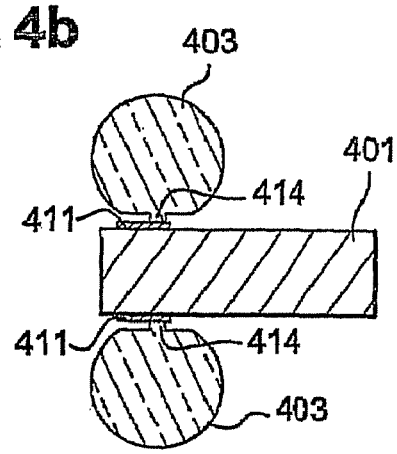
Figure 4C:
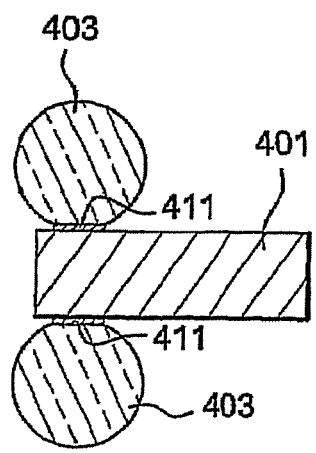
Figure 4D:
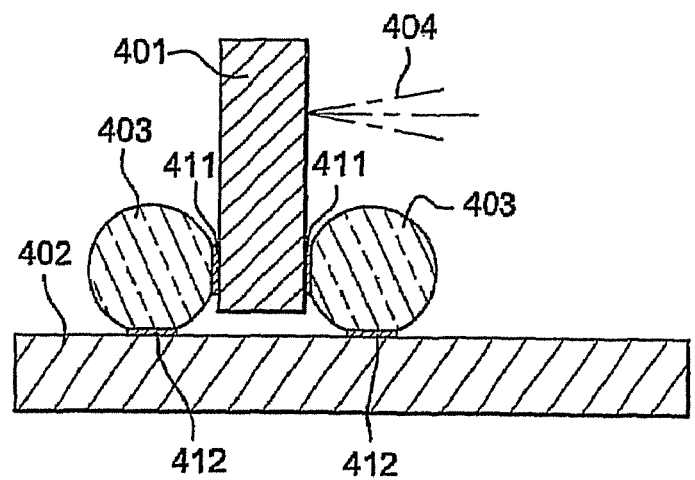

FIG. 4d illustrates a first embodiment of the assembly according to the invention. Object 401 is a Vertical Cavity Surface Emitting Laser (VCSEL) capable of emitting laser beam 404.

Object 401 is assembled with support 402 by using several solder bumps 403. In order to attach solder bumps 403 to object 401, the latter has a wettability area 411 for each solder bump 403. Similarly, in order to attach solder bumps 403 to support 402, in this case a microelectronic platform, support 402 has a wettability area 412 for each solder bump 403. Given the wettability of these areas, each solder bump 403 substantially covers wettability areas 411 and 412, with which it comes into contact when it is in the remelted state of the solder material.

In the example in FIG. 4d, wettability areas 411 and 412 consist of stacked superposed layers of metals, the melting temperature of which is higher than the melting temperature of the material that constitutes solder bumps 403. This property makes it possible not to degrade wettability areas 411 and 412 during the step to form solder bumps 403 during which the solder material is heated to above its melting temperature as explained below in detail.

In this case, solder bumps 403 consist of a fusible alloy of 60% tin (Sn) and 40% lead (Pb), whereas wettability areas 411 and 412 consist of stacks of thin layers of metals such as titanium (Ti), nickel (Ni) and gold (Au).

Such materials are in fact capable of cooperating in order to form bumps 403 that substantially or completely cover each wettability area 411 and 412. To obtain such coverage, it is known that the interface energy between the material that constitutes solder bump 403 and the material that constitutes wettability area 411 or 412 must be sufficiently low for the liquid to spread over the surface of wettability area 411 or 412.

In order to optimize the wettability of areas 411 and 412, one can provide, as in the case of FIG. 4d, for areas having a main surface which is substantially flat and disk shaped. Nevertheless, it is possible to select other wettability-area shapes as required without extending beyond the scope of this invention.

Moreover, in order to make the solder bumps, one starts by producing underbump metallizations on the object (FIGS. 4a to 4d) or on the support (FIGS. 5a to 5d). The method of fabricating the underbump metallizations and the wettability areas are explained below in relatively general terms because they are made in accordance with existing prior-art processes.

As is known, when the solder material is in a liquid state, it tends to form a globule or sphere wherever it is in contact with the ambient air. In fact, the system consisting of the liquid solder material and the air which surrounds it tends to minimize the surface energy and this results in the formation of a sphere in order to minimize the surface-area to volume-of-material ratio.

Note that use of the French term "bille" [bump], which usually denotes a spherical shape, to describe solder material 403 is not strictly correct because, firstly, this shape is truncated by the wettability areas and, secondly, the wettability areas, depending on their relative position, may exert low-intensity forces on the solder material, thus deforming the bump into an ellipsoid or even a more complex shape. This imprecise term has nevertheless gained acceptance in practical use in various technical fields and the term "bille" is therefore employed in this description to denote the shape adopted by the solder material when it comes into contact with air and wettability areas. In every case, the shape of solder bumps depends on the quantity of fusible material used and on the dimensions and positions of the wettability areas of the object and the support.

Given the conductive nature of the material that constitutes solder bumps 403, they also ensure electrical contact between wettability areas 411 and 412 and, as a result, between a circuit of support 402 and a circuit of object 401. Such electrical contact therefore makes it possible to pass current between said circuits so as to power object 401 if it is an "active" component such as VCSEL laser emitter 401.

Besides electrical contact, each solder bump 403, after cooling, fulfils a mechanical fixing function thanks to a soldered joint between wettability area 411 and wettability area 412, i.e. indirectly between VCSEL laser emitter 401 and platform 402. Typically, the cooling temperature may be room temperature.

According to one aspect of the invention, each wettability area 411 of object 401 forms an angle of 70° to 110° with respect to each wettability area 412 of support 402. In the example in FIG. 4d, this angle is 90°, i.e. wettability areas 411 are perpendicular to wettability areas 412.

Once again, imprecise terminology is used in order to make explanations simpler and for easier comprehension. In fact, the angle of 70° to 110°, in this case 90°, is actually formed by two straight lines which define, respectively, the main dimension of wettability areas 411, a vertical axis in this case, and the main dimension of wettability areas 412, a horizontal axis in this case. Consequently, object 401 is perpendicular to support 402, to the extent that the direction of the main dimension of wettability areas 411 is parallel to the direction of the main dimension of VCSEL laser emitter 401 and/or the direction of the main dimension of wettability areas 412 is parallel to the main direction of microelectronic platform 402.

Moreover, in the case of FIG. 4d, because object 401 has two flat parallel faces on which each of wettability areas 411 are made respectively and because wettability areas 412 are made in a single plane of support 402, each wettability area 411 of object 401 forms a right angle relative to each wettability area 412 of support 402.

Nevertheless, without extending beyond the scope of the invention, object 401 or support 402 may have less regular surfaces that are not parallel and not flat so that each wettability area of the object then forms any angle from 70° to 110° relative to each wettability area of the support. In such a case, the angle formed between a wettability area of the object and a wettability area of the support is generally different to the angles formed between the other wettability areas of the object and the other wettability areas of the support.

What is more, according to one aspect of the invention, object 401 and support 402 are mutually distant. In other words, as apparent in FIG. 4d, object 401 and support 402 do not come into contact with each other. This aspect makes it possible to avoid misalignment of object 401 on support 402, particularly in cases where the lower edge of object 401 has irregularities due to cutting.

Consequently, this aspect makes it possible to position the object relative to the support with greater accuracy than prior-art assemblies. An assembly in accordance with this invention is therefore capable of offering submicronic positional accuracy whereas prior-art assemblies only make it possible to achieve positioning with an accuracy of the order of several microns, as in the case of Document U.S. Pat. No. 6,647,036. What is more, this accuracy is obtained relatively simply and inexpensively because the object is positioned relative to the support exclusively by surface tension.

Figure 1:
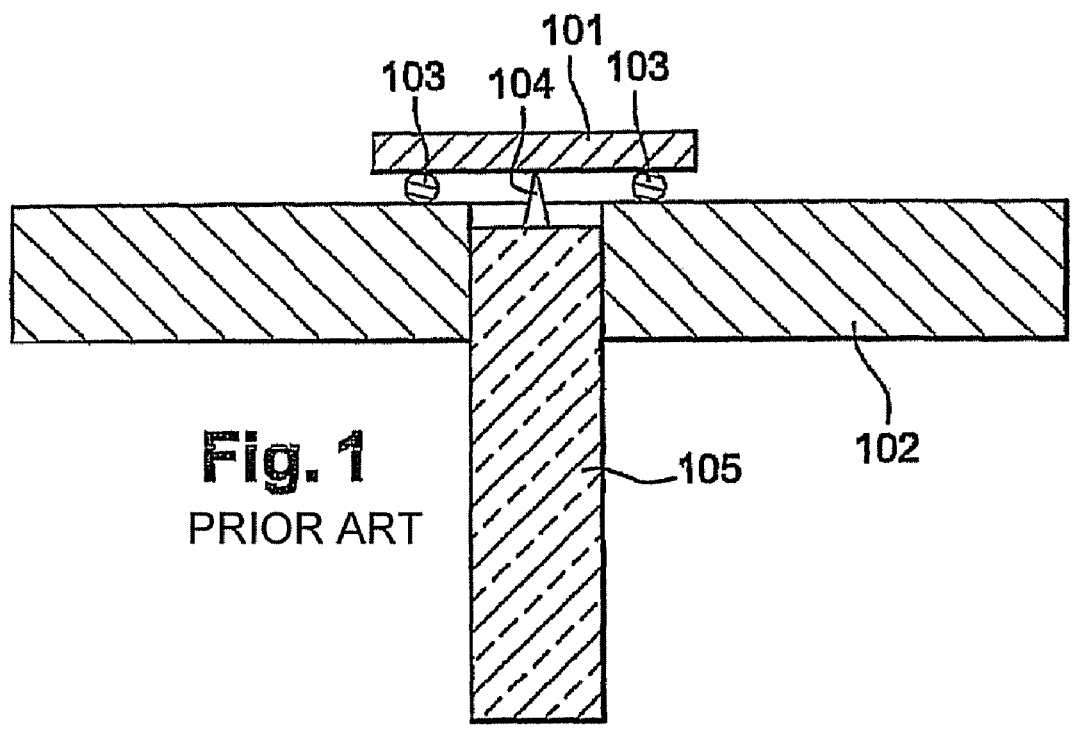
FIG. 1 is a schematic view of the assembly of a miniaturized optoelectronic component, in this case a VCSEL laser emitter, with a microelectronic platform, assembly being obtained by using a "flip chip" technique.
Figure 2:
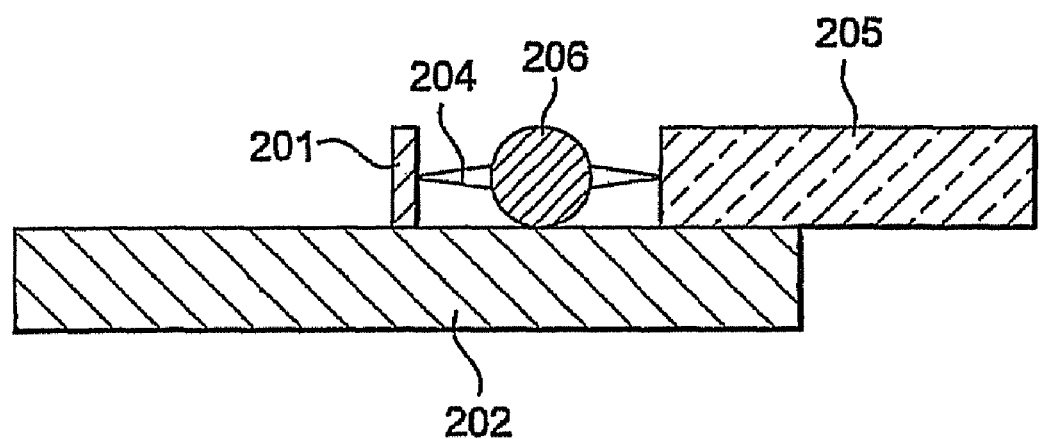
FIG. 2 is a schematic view of the assembly of a miniaturized optoelectronic component, in this case a VCSEL laser emitter, with a microelectronic platform, assembly being obtained by using a "flip chip" technique.

If object 401 consists of a VCSEL laser emitter, the latter emits an inherently slightly conical laser beam 404 having an axis of symmetry which is perfectly parallel to the plane of platform 402. Such accuracy therefore allows the laser to transmit maximum power and/or information to other components such as an optical fiber. Laser beam 404 can then be processed in the same way as laser beam 204 shown in FIG. 2.

As stated earlier, FIG. 4d shows the final step in an embodiment of the method of assembling which is the subject of this invention. During this last step, one cools down assembly 401-403 to a temperature below the melting temperature of the solder material.

Before doing so, in accordance with the method which is the subject of the invention, the steps illustrated in FIGS. 4a to 4c and involving, as shown in FIG. 4c, forming solder bumps 403 on said support 402 or on said object 401 must be completed by performing the sequence of steps detailed below.

Firstly, object 401 must be positioned a specific distance away from support 402 so that each solder bump 403 is placed substantially and partially facing the surface of each wettability area 411 of object 401 on the one hand and a corresponding surface of each wettability area 412 of support 402 on the other hand.

Then, the underbump metallizations must be heated to above the melting temperature of the solder material so as to move solder bumps 403 by surface tension so as to ensure cooperation between each solder bump 403 and one of wettability areas 411 of object 401 on the one hand and one of wettability areas 412 of support 402 on the other hand.

More precisely and according to the invention, the step to form solder bumps 403 on object 401 comprises a sequence of steps that involve initially depositing a sacrificial coating 413 on wettability areas 411 of object 401. This sacrificial coating 413 is relatively non-wetting in relation to the solder material and has a melting temperature higher than that of the solder material. In addition, sacrificial coating 413 extends asymmetrically over the main surface of each wettability area of object 401.

Then, holes must be drilled in sacrificial coating 413, each emerging on the surface of a wettability area 411 of object 401 and towards that part of wettability area 411 of object 401 which is opposite the closest edge of object 401. Thus, each hole is off-centered relative to the surface of the wettability area of the object on which it emerges and the bumps formed do not protrude beyond the edge of the object. One can also make provision for drilling several holes in the same wettability area.

Then, the underbump metallizations must be made by depositing solder material on sacrificial coating 413, as well as in said holes, and the underbump metallizations must be heated to above the melting temperature of the solder material so as to turn them, due to surface tension, into solder bumps 403 which completely or partially cover sacrificial coating 413.

Following this step, one removes sacrificial coating 413, for example by means of etching, so that each bump is then connected to a wettability area 411 via a stalk 414 originating from the solder material deposited in the hole. The stalk is therefore positioned on that part of the wettability area opposite the closest edge of the object. The "mushroom" formed by the bump and its stalk is therefore off-centered with respect to the main surface of wettability area 411.

Then, the edge of object 401 which is the closest to wettability area 411 must be cut in order to reduce one of the dimensions of the object. Such cutting ensures there is no contact between the object and the support in the resulting assembly.

Finally, one heats solder bumps 403 to above their melting temperature so as to completely cover each wettability area 411, with the periphery of solder bumps 403 protruding beyond the edge of object 401 obtained from the cutting step and bumps 403 covering wettability areas 401 of support 402 due to the effect of surface tension.

Alternatively, but in a similar way, in the first embodiment of the method and the assembly which is the subject of the invention shown in FIGS. 4a to 4d, it is possible to form the solder bumps on the support rather than on the object in accordance with a second embodiment. In the examples in FIGS. 5a to 5d, solder bumps 503 are formed on support 502 and then attached by soldering to object 501, which once again is a VCSEL laser emitter. Like the embodiment of the method described in relation to FIGS. 4a to 4d, one uses a sacrificial coating 513 that extends asymmetrically over each wettability area 512, 517 of support 502.

Figure 5A:
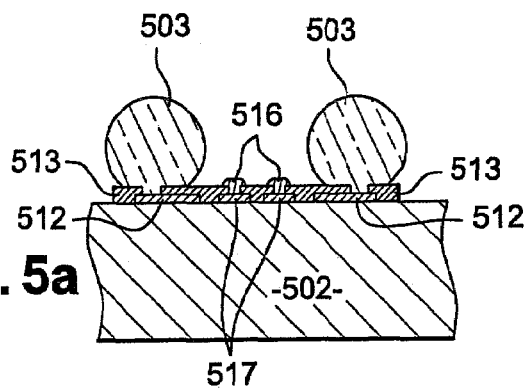
FIGS. 5a to 5d are schematic side views showing certain steps in a second embodiment of the method of assembling which is the subject of this invention.
Figure 5B:
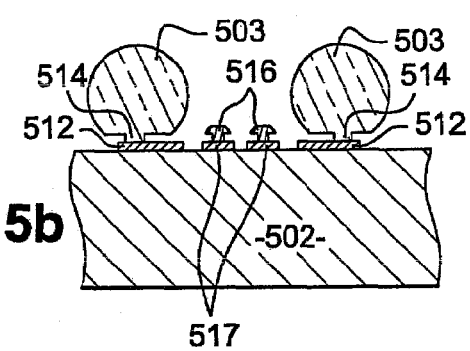
Figure 5C:
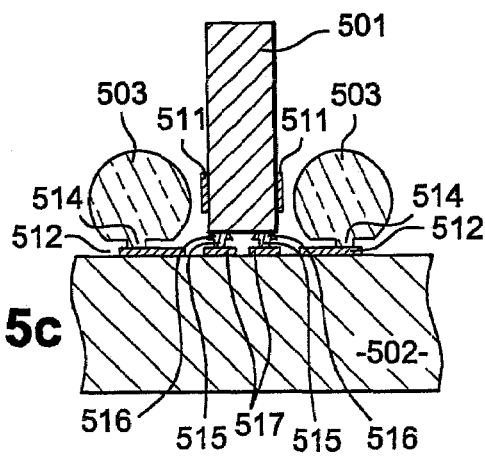
Figure 5D:
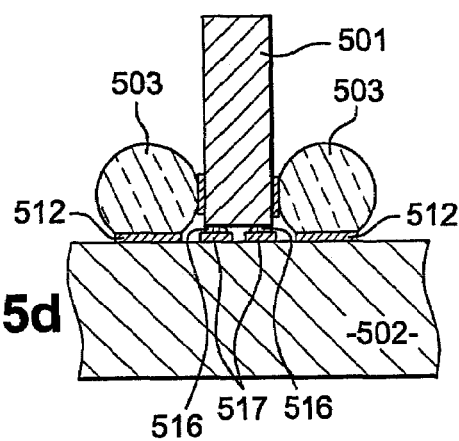

Unlike the assembly shown in FIG. 4d, the assembly shown in FIG. 5d has two kinds of solder bumps 503 and 516 which fulfil different functions. Solder bumps 503 play a role similar to that of solder bumps 403, namely they ensure electrical connection and mechanical attachment of platform 502 to VCSEL laser emitter 501. Because their functions and compositions are similar to those of bumps 403, they are not described below in greater detail.

As well as bumps 503, the assembly in FIG. 5d has solder bumps 516 which are in contact with the lower edge of VCSEL laser emitter 501. Bumps 516 are intended to damp the downward movement of object 501 during the step when bumps 503 are remelted and until bumps 503 wet the main surface areas of wettability areas 512 of support 502 and 511 of object 501 substantially and sufficiently to support the weight of object 501.

To achieve this, bumps 516 must be made of a solder material that has a melting temperature substantially equal to the melting temperature of the material that constitutes solder bumps 503. In the example in FIG. 5d, bumps 516 and bumps 503 are all made of the same material. This is a fusible alloy of 60% tin and 40% lead, but can also be other alloys or pure metals comprising gold, tin, lead and/or indium.

In this second embodiment of the invention, the step to form large bumps 503 on wettability areas 512 of support 502 is similar to that described in relation to FIGS. 4a to 4c, apart from the fact that solder bumps 503 are initially connected to support 502 before being connected to object 501. Consequently, the step to form bumps 503 comprises a succession of steps illustrated in FIGS. 5a to 5c and involves:

depositing on wettability areas 512 of support 502 a sacrificial coating 513 that is relatively non-wetting in relation to the solder material and having a melting temperature higher than that of the solder material, said sacrificial coating 513 extending asymmetrically over the main surface of each wettability area of support 502;

then drilling holes in sacrificial coating 513, each emerging on the main surface of a wettability area 512 of support 502 and offset towards the side opposite the other wettability area 512 of support 502;

producing underbump metallizations by depositing solder material on sacrificial coating 513, as well as in the hole;

heating the underbump metallizations to above the melting temperature of the solder material so as to turn them, due to surface tension, into solder bumps 503 which completely or partially cover sacrificial coating 513;

removing sacrificial coating 513, for example by means of etching, each bump 503 then being connected to a wettability area 512 via a stalk 514 originating from the solder material deposited in the hole, stalk 514 being positioned on wettability area 512 at the end opposite the other wettability area 512 of support 502.

Note that small solder bumps 516 are formed using the same method as that used to form large solder bumps 503. When solder bumps 516 are in the state shown in FIG. 5b, i.e. once the bumps are predisposed to receive object 501, the step to position the object comprises a succession of steps involving:

positioning object 501 between the two large bumps 503 which are in contact with small bump 516;

heating solder bumps 503 and 516 to above the melting temperature of the solder material so as to substantially or completely cover, by surface tension, each wettability area 512 and 517 of object 502 with the bumps also covering wettability areas 511 of object 501.

On completion of this step to position object 501 and after the step to cool the distinctive assembly of the method which is the subject of the invention, VCSEL laser emitter 501 is assembled on microelectronic platform 502 via solder bumps 503 which are attached to wettability areas 511 and 512, as shown in FIG. 5d.

In the example in FIG. 5d, object 501 is then in contact with small bumps 516. Nevertheless, depending on the location chosen for wettability areas 511 on object 501 and depending on the quantity of solder material that forms bumps 503 and 516, one can make provision to prevent object 501 having contact with bumps 516. The weight of object 501 is then supported only by solder bumps 503 due to the surface tension that exists at the interface between each bump 503 and each wettability area 511. Thus, small solder bumps 516 remain isolated from object 501 after having withstood and damped its downward movement during the positioning step.

Since object 501 remains some distance away from support 502, i.e. there is no contact between them, positioning or alignment of object 501 relative to support 502 can be performed with greater accuracy than that obtainable with prior-art assemblies.

Figure 3A:
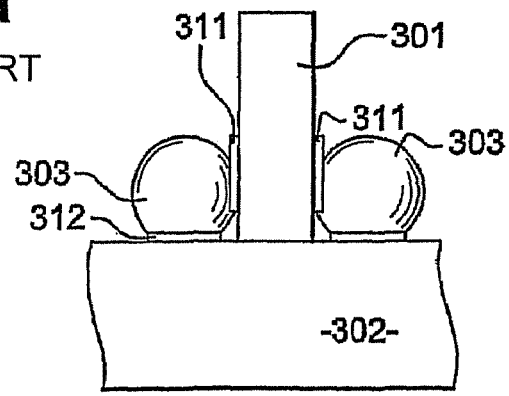
FIGS. 3a to 3c are schematic views showing the disadvantages of prior-art methods of assembling.
Figure 3B:
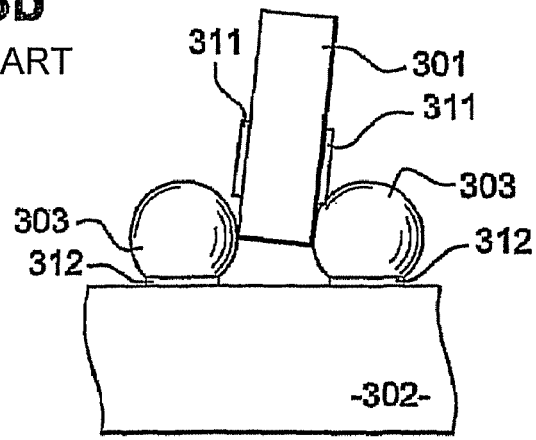
Figure 3C:
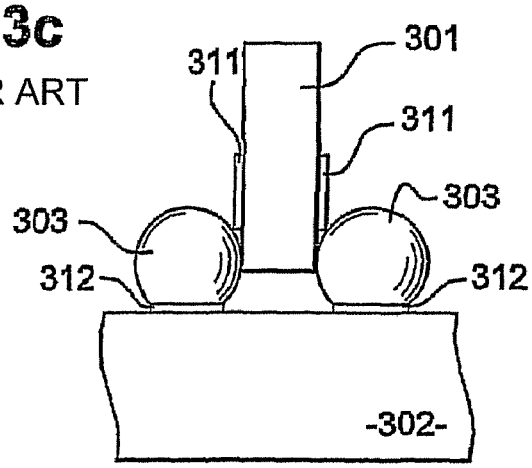

Also, given the spacing of solder bumps 503 in the step shown in FIG. 5c which is made possible by using sacrificial coating 513, it is relatively easy to place object 501 between the two bumps 503 before each remelting step during which solder bumps 503 move closer to wettability areas 511 of object 501 "naturally". This movement towards the wettability areas is due to surface tension at the interface between each bump 503 and each wettability area 512 of support 502. Using sacrificial coating 513 makes it possible to alleviate or even avoid problems associated with poor dimensioning or incorrect positioning of wettability areas, such as those shown in FIGS. 3b and 3c.

Note that here it is not necessary to off-center the stalks 515 of small bumps 516 on wettability areas 517. In fact, the spacing of small bumps 516 has no impact on the possibility of inserting object 501 between large bumps 503.

To ensure stable assembly of object 401 or 501 on support 402 or 502, it is preferable to make provision to firmly "clamp" the object between at least two pairs of solder bumps 403, 503. The term "pairs of solder bumps" should be construed as two bumps located facing each other and on either side of the object. It is therefore preferable to form at least three bumps distributed over two opposite faces of the object in order to ensure a certain degree of stability.

Figure 6:
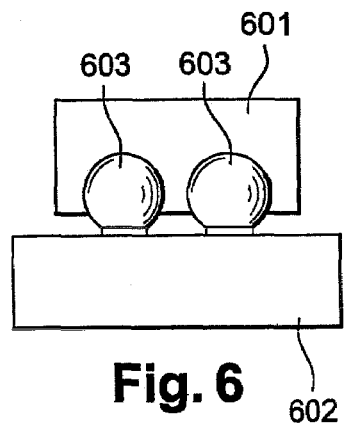
FIG. 6 is a schematic front view of the assembly shown in FIG. 5d.
Figures 10A, 10B:
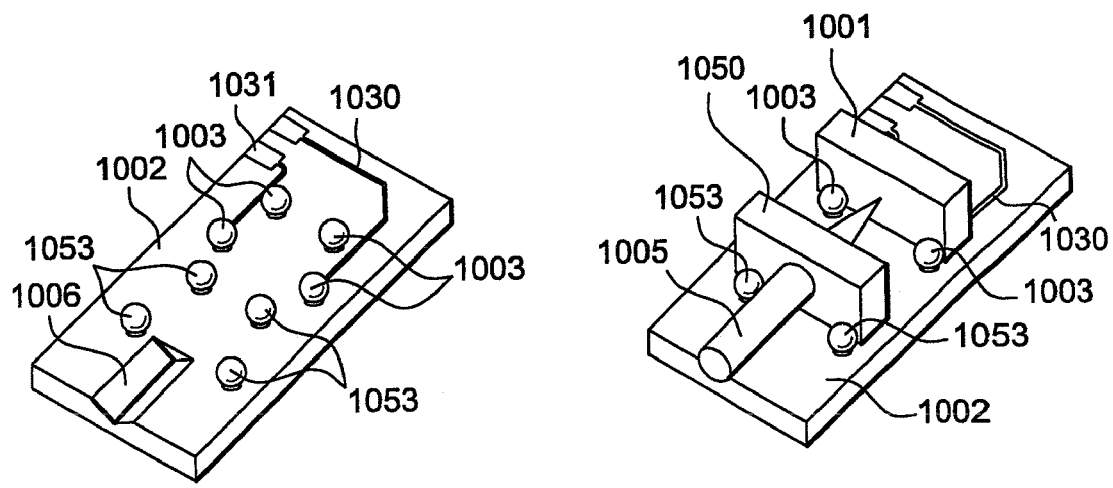
FIGS. 10a and 10b are schematic perspective views showing two steps in another embodiment of the method of assembling which is the subject of this invention.

FIG. 6 shows a front view of the assemblies illustrated in FIGS. 4d and 5d where assembly is obtained by using two pairs of solder bumps 603 mounted side by side on support 602. Bumps 603 in each of the pairs are located facing each other on either side of object 601. However, depending on mounting constraints or other constraints, the bumps in each of the pairs can be slightly offset, as shown in FIG. 10a.

Figure 7A:
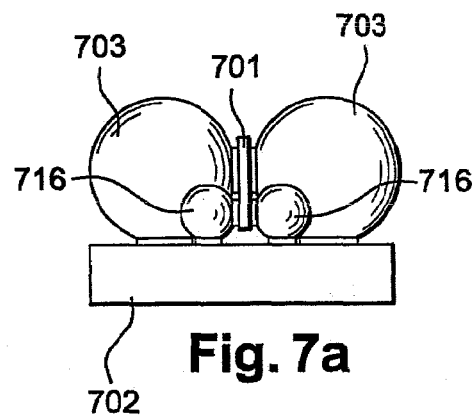
FIGS. 7a and 7b are schematic side and front views of a third embodiment of the assembly which is the subject of this invention.
Figure 7B:
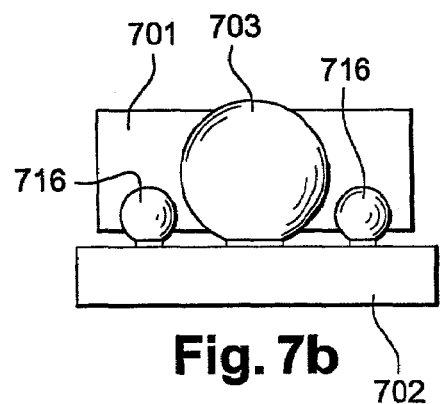

As an alternative to the embodiment shown in FIG. 6 where solder bumps 603 have the same dimensions, one can make provision to produce solder bumps having different dimensions. Such an assembly is shown in FIGS. 7a and 7b, viewed from the side and from the front respectively. In this assembly, object 701 is assembled on support 702 by using large solder bumps 703 and small solder bumps 716. As stated above, the pairs of solder bumps 703, 716 are mounted side by side on support 702 so as to secure object 701 in a stable state, also when the bumps are in the remelted state. With such a structure, large bumps 703 support most of the weight of object 701 because they have a large interface with the object whereas small bumps 716 are used to ensure lateral stability and positional accuracy when using the method of assembling which is the subject of the invention.

Figure 8:
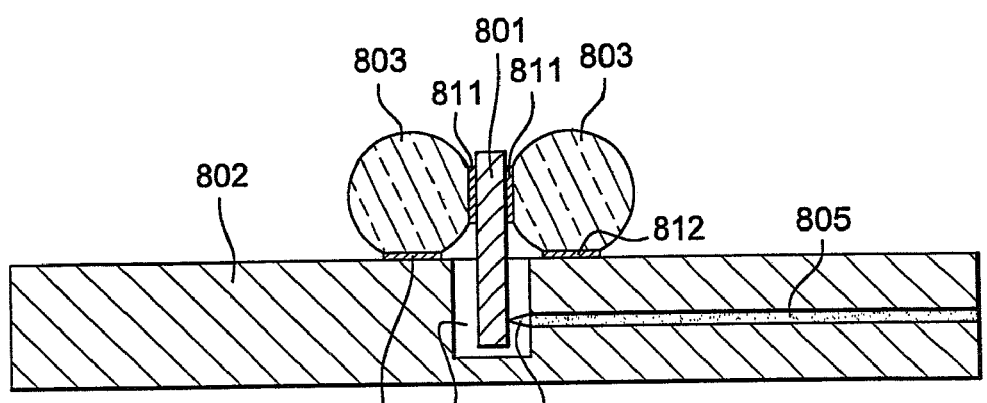
FIG. 8 is a schematic side view of a fourth embodiment of the assembly which is the subject of this invention.

FIG. 8 shows another embodiment of the assembly which is the subject of this invention. In this assembly, the lower part of VCSEL laser emitter 801 is accommodated in cavity 820 made in microelectronic platform 802. In accordance with the invention, wettability areas 811 are made on either side of object 801 and at specific locations on the surface of support 802, in order to receive solder bumps 803.

In accordance with one aspect of the invention, object 801, once assembled by means of solder bumps 803, remains some distance away from support 802, in this case in the bottom of cavity 820. As explained earlier, this lack of contact between the object and support helps improve the accuracy with which the former is positioned on the latter.

In order to obtain such assembly, an embodiment of the method according to the invention must be used which includes a preliminary step involving producing cavity 820 in the support and where the step to position object 801 involves:

positioning the lower part of the object 801 in said cavity 820 so that wettability areas 811 of object 801 are at a height above that of the center of gravity of object 801 and above the height of the upper surface of support 802;

heating solder bumps 803 to above the melting temperature of the solder material so as to substantially cover, by surface tension, each wettability area 811 and 812 with the bumps covering wettability areas 811 of object 801; the object aligns itself vertically due to the effect of gravity, on the one hand, and the surface tension forces produced by solder bumps 803 melted on wettability areas 811 of object 801, on the other hand.

The height of the clearance between the lower edge of object 801 and the lower edge of cavity 820 depends on several parameters. These parameters include, firstly, the height of wettability areas 811 on object 801, the height of the center of gravity of object 801, the quantity of solder material intended to form bumps 803 and the depth of cavity 820.

Obviously, these various parameters are determined depending on the desired clearance or distance between the lower edge of object 801 and the bottom of cavity 820. The term "lower edge" is used to denote the edge that is located at a lower height than if the assembly rested horizontally on support 802. In practice, the clearance between object 801 and support 802 is primarily determined so that laser beam 804 emitted by VCSEL laser emitter 801 propagates in the direction of an optical fiber 805 embedded in support 802.

Because of lack of contact between the object and support, object 801 can be positioned with far greater accuracy than that achievable with prior-art assemblies. This way one can make sure that laser beam 804 transmits maximum power to optical fiber 805. This embodiment of the assembly which is the subject of the invention does not require the use of a sacrificial coating, in contrast to the embodiments described above, when using the method of assembling object 801 and support 802.

As stated earlier, it is possible to make provision for an angle other than 90° between the wettability areas of the object and those of the support. Thus, in the assembly shown in FIG. 9, the main direction of VCSEL laser emitter 901 forms, overall, a 75° angle 921 with respect to the plane of microelectronic platform 902. Thanks to this construction, VCSEL laser emitter 901 outputs oblique laser beam 904 in the direction of optical fiber 905. Such an assembly makes it possible to optimize the emission of the laser beam in the direction of optical fiber 905 which is obliquely polished in order to limit stray reflections.

Figure 9:
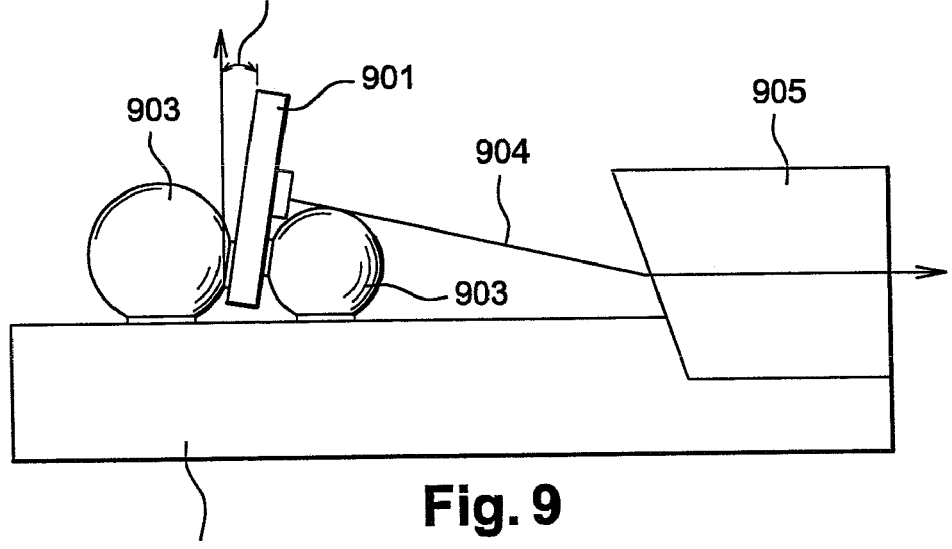
FIG. 9 is a schematic side view of a fifth embodiment of the assembly which is the subject of this invention.

To implement such an assembly, it is preferable to form bumps 903 of different sizes in a single pair of bumps. In addition, the wettability zones of the object must be dimensioned and positioned asymmetrically, as shown in FIG. 9. Apart from these particular features, a method of assembling similar to those described in relation to FIG. 4 or 5 must be used, i.e. a method which uses a sacrificial coating. These methods of assembling are therefore not described here.

FIGS. 10a and 10b show two juxtaposed assemblies of VCSEL laser emitter 1001 and miniaturized optical component 1050. Miniaturized optical component 1050 is actually an optical chip intended to process the laser beam emitted by laser 1001 before it is guided into optical fiber 1005. The optical fiber is accommodated in V-shaped groove 1006 made in support 1002, in this case a microelectronic platform, said V-shaped groove 1006 making it possible to position the optical fiber precisely relative to the reference frame that constitutes platform 1002. Objects 1001 and 1050 are assembled with platform 1002 in accordance with the invention and, in particular, using a method analogous to that described in relation to FIGS. 5a to 5d.

However, in FIG. 10a it is apparent that bumps 1003 and 1053 which are intended to be attached to the front faces of objects 1001 and 1050 are laterally staggered relative to the optical axis compared with solder bumps 1003 and 1053 which are intended to be attached to the rear faces of objects 1001 and 1050. Such offsetting makes it possible to ensure a certain degree of stability when objects are assembled on platform 1002, especially in the transverse direction.

As can be seen in FIGS. 10a and 10b, electrical circuits 1030 and 1031 are connected to wettability areas and solder bumps 1003 of VCSEL laser emitter 1001. The latter can thus be electrically powered by a power source (not shown). In contrast, optical processing chip 1050, which is a passive component, does not require any power supply so platform 1002 does not have an electrical circuit connected to bumps 1053 which are intended to be attached to object 1050.

Underbump metallizations made of solder material are produced in a known manner using conventional techniques which include depositing a metallized bonding layer, photolithography, removal of material by etching, electrolytic growth etc. Because all these techniques for forming underbump metallizations and hence solder bumps are familiar, their characteristics are not described in this document.

The only non-standard aspect of the formation of underbump metallizations in the method of assembling according to the invention involves depositing a layer of sacrificial coating and then making holes in it before applying the solder material to the substrate which may consist of a wafer of semiconductor material. This sacrificial coating is also produced using conventional techniques such as depositing a thin film by evaporation or spraying.

Moreover, if the initial substrate used is a wafer of semiconductor material, whether to produce solder bumps on the object or on the support, this substrate may comprise one or more electronic components and/or one or more sensors. This makes it possible to produce a complex system that fulfils multiple functions with a relatively high packing density.

An assembly such as those described above can be used, for example, to equip a transceiver system deployed in optical networks used to transfer data in the telecommunications sector.

What is more, although the examples explained in relation to the Figures relate mainly to mounting a VCSEL laser emitter, the invention is obviously not confined to such components and it can be used with many other objects and supports.

It can be used to mount MEMS chips or accelerometers. In the case of accelerometers, the invention is particularly advantageous for producing a sensor capable of measuring vibrations in three dimensions in space. This is achieved by assembling two accelerometers with a third accelerometer and using one of the methods which are the subject of the invention, along the three measuring axes. The invention thus makes it possible to implement an extremely accurate three-dimensional accelerometer.

Other implementations are possible without extending beyond the scope of this invention. It is possible to envisage an embodiment which is a hybrid of the embodiments shown in FIGS. 4 and 5 in which certain bumps are formed on the object and other bumps are formed on the support. One could even envisage an embodiment where the bumps are formed partly on the object and partly on the support.

The invention claimed is:

1. An assembly of an object and a support joined together by solder bumps comprising:
   at least first and second wettability areas formed on said object and at least first and second wettability areas formed on said support; and
   a solder bump centered on said first wettability areas of said object and said support and another solder bump centered on said second wettability areas of said object and said support, wherein each solder bump ensures electrical contact and mechanical fixing between the first wettability areas and between the second wettability areas, respectively,
   wherein the melting temperature of said solder bumps is below the melting temperature of each wettability area, and
   wherein the first and second wettability areas form an angle of 70° to 110° with respect to one another, and
   wherein said object and said support are spaced from one another.

2. An assembly as claimed in claim 1, wherein said angle substantially equals 90°.

3. An assembly as claimed in claim 1, wherein the lower part of said object is accommodated in a cavity made in said support with the lower edge of said object being some distance away from the bottom of said cavity.

4. An assembly as claimed in claim 1, wherein said solder bumps have different dimensions.

5. An assembly as claimed in claim 1, wherein the material that constitutes said solder bumps consists of a pure element or an alloy of elements selected from the group comprising tin (Sn), lead (Pb), gold (Au) and indium (In).

6. An assembly as claimed in claim 1, wherein each wettability area comprises a stack of several layers of materials comprising elements selected from the group consisting of titanium, nickel and gold.

7. An assembly as claimed in claim 1, wherein said support is a microelectronic platform and said object is an optical or optoelectronic component such as a Vertical Cavity Surface Emitting Laser (VCSEL).

8. An assembly of an object and a support joined together by solder bumps comprising:
   at least first and second wettability areas formed on said object and at least first and second wettability areas formed on said support; and
   a solder bump centered on said first wettability areas of said object and said support and another solder bump centered on said second wettability areas of said object and said support, wherein each solder bump ensures electrical contact and mechanical fixing between the first wettability areas and between the second wettability areas, respectively,
   wherein the melting temperature of said solder bumps is below the melting temperature of each wettability area, and
   wherein the first and second wettability areas form an angle of 70° to 110° with respect to one another,
   wherein said object and said support are spaced from one another, and
   wherein the first and second wettability areas are spaced from one another so as not to contact one another.

* * * * *